United States Patent [19]

Lee

[11] Patent Number: 5,077,225
[45] Date of Patent: Dec. 31, 1991

[54] PROCESS FOR FABRICATING A STACKED CAPACITOR WITHIN A MONOLITHIC INTEGRATED CIRCUIT USING OXYGEN IMPLANTATION

[75] Inventor: Ruojia Lee, Boise, Id.

[73] Assignee: Micron Technology, Inc., Boise, Id.

[21] Appl. No.: 693,731

[22] Filed: Apr. 30, 1991

[51] Int. Cl.$^5$ .................. H01L 21/266; H01L 21/72
[52] U.S. Cl. ........................................ 437/24; 437/47; 437/48; 437/52
[58] Field of Search .................. 437/26, 47, 48, 52; 357/23.6

[56] References Cited

U.S. PATENT DOCUMENTS 4,700,457 10/1987 Matsukawa ........................ 437/52

FOREIGN PATENT DOCUMENTS 0047067 2/1989 Japan .................................. 437/52

Primary Examiner—Olik Chaudhuri
Assistant Examiner—Ourmazd S. Ojan
Attorney, Agent, or Firm—Angus C. Fox, III

[57] ABSTRACT

A process for fabricating a stacked capacitor for use in monolithic integrated circuits using oxygen implantation. This invention provides a relatively simple process for manufacturing stacked capacitors having two series of interleaved plates. The process is unique, in that rather than requiring the use of a different material for each series of conductive plates, utilizes polycrystalline silicon for both series. The process proceeds with the deposition of alternating dielectric and polycrystalline silicon ("poly") layers, beginning and ending with a dielectric layer. Each poly layer is masked with photoresist, implanted with oxygen in unmasked regions, and then thermally annealed to convert all silicon in the unmasked regions into silicon dioxide. Each non-implanted poly region is horizontally offset from the non-implanted poly regions of the nearest superjacent and subjacent poly layers, which are, themselves, horizontally aligned. The resulting layer stack is masked and anisotropically etched, stopping on the bottom dielectric layer, to form a block of stacked layers, one vertical side of which comprises unoxidized edges of even numbered poly layers and oxidized edges of odd numbered poly layers, and a second vertical side of which comprises unoxidized edges of odd numbered poly layers and oxidized edges of even numbered poly layers. A tying layer is then blanket deposited over the block, masked and etched so that the unoxidized edges of even numbered poly layers are electrically connected by one a first typing layer remnant, while the oxidized edges of odd numbered poly layers are electrically connected by a second tying layer remnant.

15 Claims, 4 Drawing Sheets

PROCESS FOR FABRICATING A STACKED CAPACITOR WITHIN A MONOLITHIC INTEGRATED CIRCUIT USING OXYGEN IMPLANTATION

FIELD OF THE INVENTION

This invention relates to monolithic semiconductor circuit process technology and, more specifically, to a process for creating insulated plate edges in a multilayered stacked capacitor via oxygen implantation.

BACKGROUND OF THE INVENTION

A variety of three-dimensional structures for stacked capacitors fabricated within a monolithic integrated circuit have been proposed. The fabrication of these structures generally adds a great deal of complexity to the manufacturing process. In addition, incomplete structures may be very delicate, requiring inordinate care during wafer handling to avoid structure breakage that could result not only in defective cells, but also in particle contamination elsewhere in the array. The DRAM cell structure proposed by T. Ema of Fujitsu Corporation at the 1988 International Electron Devices Meeting in San Francisco, California (592-595 IEDM 88) is an example of such a structure. The polysilicon fins, from which the cell capacitor plates are constructed must remain exposed and unsupported during many process steps. In addition, exceptional conformality of deposited nitride and polysilicon layers is essential to the fabrication process. If inter-fin gaps are not maintained within a narrow range of 500-1000Å, conformal deposition of the cell dielectric and cell plate layers becomes nearly impossible.

The stacked capacitor structure that is the subject of U.S. Pat. No. 4,827,323 issued to Howard L. Tigelaar, et al, of Texas Instruments Inc. on May 2, 1989, has several advantages over the Fujitsu device described above, in that the capacitor structure never experiences a delicate stage wherein it is vulnerable to breakage. In addition, deposition and clearance parameters are not as stringent. The stacked capacitor disclosed by Tigelaar, et al, consists of first and second series of interleaved plates, each plate of the first series being insulated from an adjacent plate of the second series by a thin dielectric layer. Each plate of the first series is interconnected along an edge thereof with other plates of the first series by a first interconnection layer. Dielectric borders insulate the edges of plates pertaining to the second series from the first interconnection layer. Likewise, each plate of the second series is interconnected by an edge thereof with other plates of the second series by a second interconnection layer. Dielectric borders insulate the edges of plates pertaining to the first series from the second interconnection layer. In order to facilitate the creation of the dielectric borders, the first series plates are made from a first material (e.g., molybdenum), which can be selectively etched with respect to both a second material (e.g., doped polysilicon), from which the second series of plates are fabricated, and a third material (e.g., silicon dioxide) from which the thin dielectric layers are fabricated. The dielectric borders, themselves, require the deposition of yet an additional layer. This multiplicity of materials and large number of deposition steps complicates the fabrication process to the point where other capacitor designs may more attractive.

What is needed is an improved capacitor having a configuration similar to that of Tigelaar, et al, the fabrication of which requires the deposition of only two materials, one for both series of conductive layers and dielectric borders, and the other for the dielectric layers.

SUMMARY OF THE INVENTION

This invention provides a far less complex process for manufacturing a stacked capacitor of the configuration described by Tigelaar, et al, in U.S. Pat. No. 4,827,323. The process, rather than requiring the use of a different material for each series of conductive plates, utilizes polycrystalline silicon for both series.

The process proceeds with the deposition of alternating dielectric and polycrystalline silicon ("poly") layers, beginning and ending with a dielectric layer. Each poly layer is masked with photoresist, implanted with oxygen in unmasked regions, then thermally annealed to convert all silicon in the unmasked regions into silicon dioxide. Each non-implanted poly region is horizontally offset from the non-implanted poly regions of the nearest superjacent and subjacent poly layers, which are, themselves, horizontally aligned. The resulting layer stack is masked and anisotropically etched, stopping on the bottom dielectric layer, to form a block of stacked layers, one vertical side of which exposes unoxidized edges of even numbered poly layers and oxidized edges of odd numbered poly layers, and a second vertical side of which exposes unoxidized edges of odd numbered poly layers and oxidized edges of even numbered poly layers. A tying layer is then blanket deposited over the block, masked and etched so that the unoxidized edges of even numbered poly layers are electrically connected by one a first tying layer remnant, while the unoxidized edges of odd numbered poly layers are electrically connected by a second tying layer remnant. Individual tying layer remnants may be employed to monolithically interconnect the capacitor to other circuitry.

BRIEF DESCRIPTION OF THE DRAWINGS

FIG. 1 is a cross-sectional view through a substrate, following blanket deposition of a base dielectric layer, blanket deposition of a first poly layer, masking of the first poly layer with photoresist, and implanting unmasked portions of the first poly layer with oxygen;

FIG. 2 is the cross-sectional view of FIG. 1, following a photoresist strip, thermal anneal, and blanket deposition of a first capacitive dielectric layer;

FIG. 3 is the cross-sectional view of FIG. 2, following blanket deposition of a second poly layer, masking of the second poly layer with photoresist, and implanting unmasked portions of the second poly layer with oxygen;

FIG. 4 is the cross-sectional view of FIG. 3, following a photoresist strip, thermal anneal, blanket deposition of a second capacitive dielectric layer, blanket deposition of a third poly layer, masking of the third poly layer with photoresist, and implanting unmasked portions of the third poly layer with oxygen;

FIG. 5 is the cross-sectional view of FIG. 4, following photoresist strip, final thermal anneal, and masking of resultant layer stack with photoresist;

FIG. 6 is the cross-sectional view of FIG. 5, following an anisotropic etch of the layer stack, stopping on the base dielectric layer, and a photoresist strip;

FIG. 7 is the cross-sectional view of FIG. 6 following blanket deposition and photoresist masking of a tying poly layer; and FIG. 8 is the cross-sectional view of FIG. 7 following an etch of unmasked portions of the tying poly layer and a photoresist strip.

PREFERRED EMBODIMENT OF THE INVENTION

Figure 1:
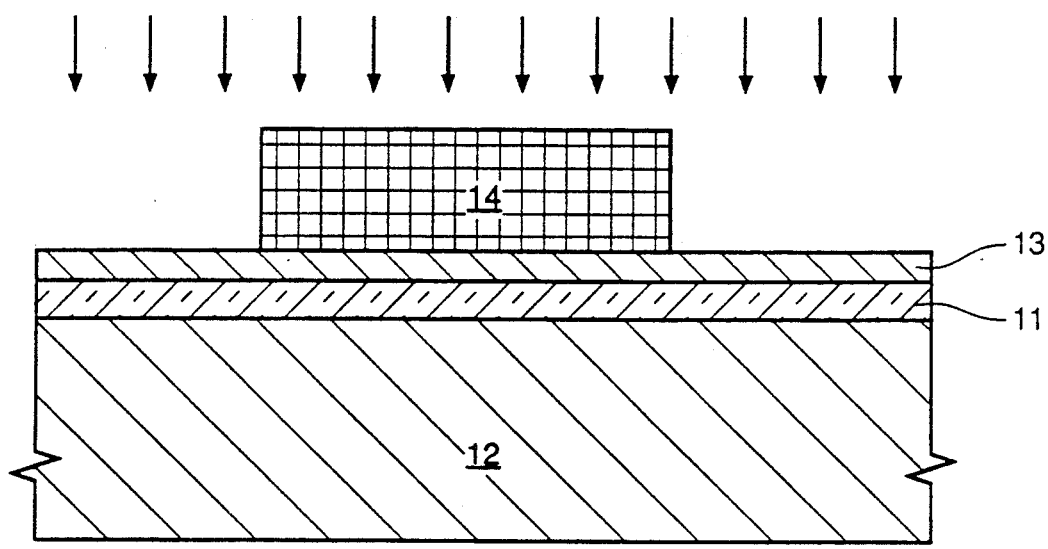
FIGS. 1 through 8 are cross-sectional schematic diagrams depicting the processing steps of this invention.

Referring now to FIG. 1, a base dielectric layer 11 has been blanket deposited on substrate 12. Ideally, the base dielectric layer 11 will have a thickness far greater than subsequently-deposited inter-plate dielectric layers. A first, conductively-doped poly layer 13 is blanket deposited on top of base dielectric layer 11. First polylayer 13, and all subsequently deposited poly layers from which capacitor plates are formed, have a thicknesses within a range of 100–500Å. First poly layer 13 is then masked with first photoresist mask 14, after which unmasked portions of first poly layer 13 are implanted with oxygen to an extent sufficient to convert all silicon in the implanted regions of first poly layer 13 to silicon dioxide during subsequent thermal annealing. In order to convert all the silicon in the implanted regions to silicon dioxide, implantation of at least twice as many oxygen atoms per unit area as there are silicon atoms per unit area for a given poly layer thickness is required. However, conduction within doped polysilicon is disrupted significantly at far lower dosages. Consequently, oxygen dosages within a range of one-fourth to parity with the number of silicon atoms present in the implanted layer regions is sufficient. Ideally, implantation energy is maintained at a level sufficient to position the majority of implanted oxygen atoms at a level that is approximately midway through the poly layer, thus preventing penetration of base dielectric layer 11.

Figure 2:
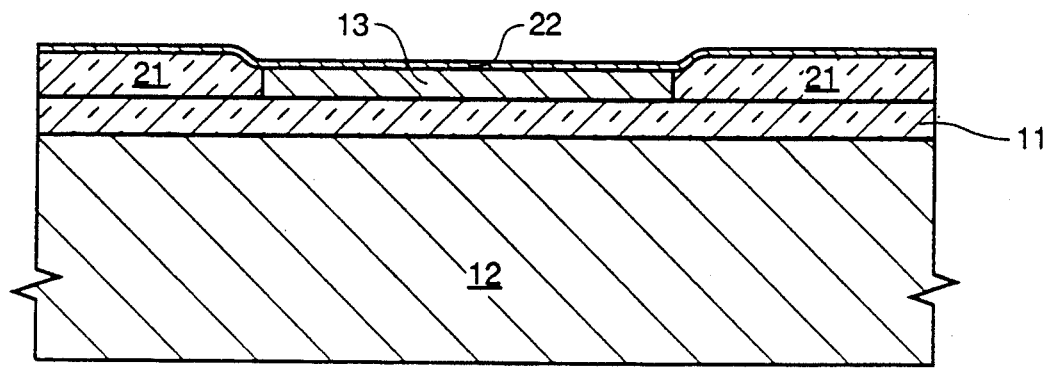

Referring now to FIG. 2, first photoresist mask 14 has been stripped, and the wafer has been thermally annealed (preferably using a rapid thermal anneal process). The annealing process has caused a swelling of the implanted regions 21 as silicon was converted to silicon dioxide. Subsequent to the annealing process, a first capacitive dielectric layer 22 is deposited on top of first poly layer 13.

Figure 3:
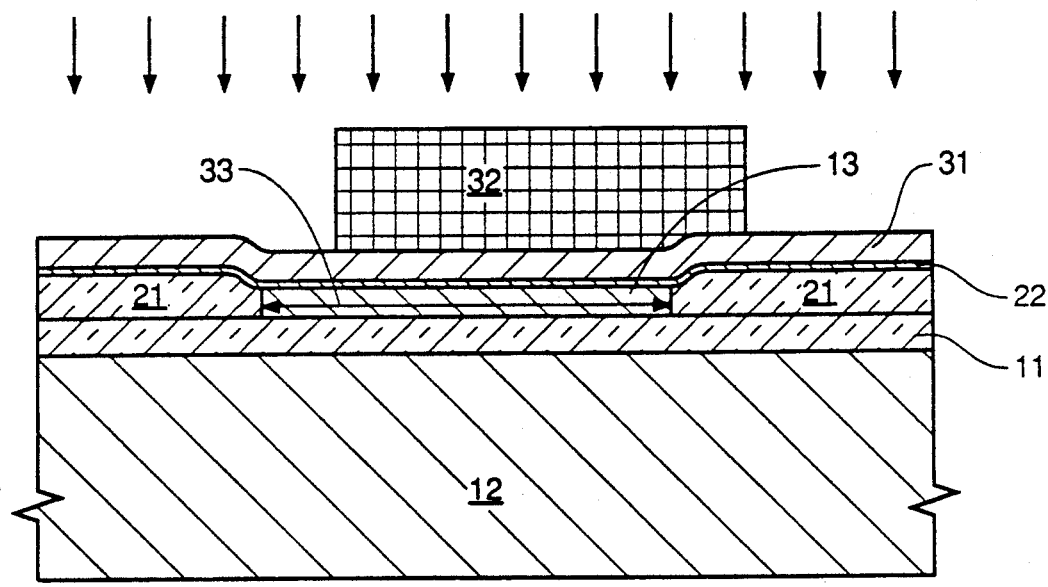

Referring now to FIG. 3, a second conductively-doped poly layer 31 has been deposited on top of first capacitive dielectric layer 21. Second poly layer 31 is then masked with second photoresist mask 32 that is substantially the same size and shape as first second photoresist mask 14. However, second photoresist mask 32 has been shifted to the right with respect to the former location of now-removed first photoresist mask 14, such that the left edge of second photoresist mask 32 underlaps the left edge of the unimplanted region 33 of first poly layer 13, and the right edge of second photoresist mask 32 overlaps the right edge of the unimplanted region 33 of first poly layer 13. Following the creation of second photoresist mask 32, the unmasked portions of second poly layer 31 are implanted with oxygen. Implantation energy and implantation dosage criteria are the same as form the earlier implantation of first poly layer 13.

Figure 4:
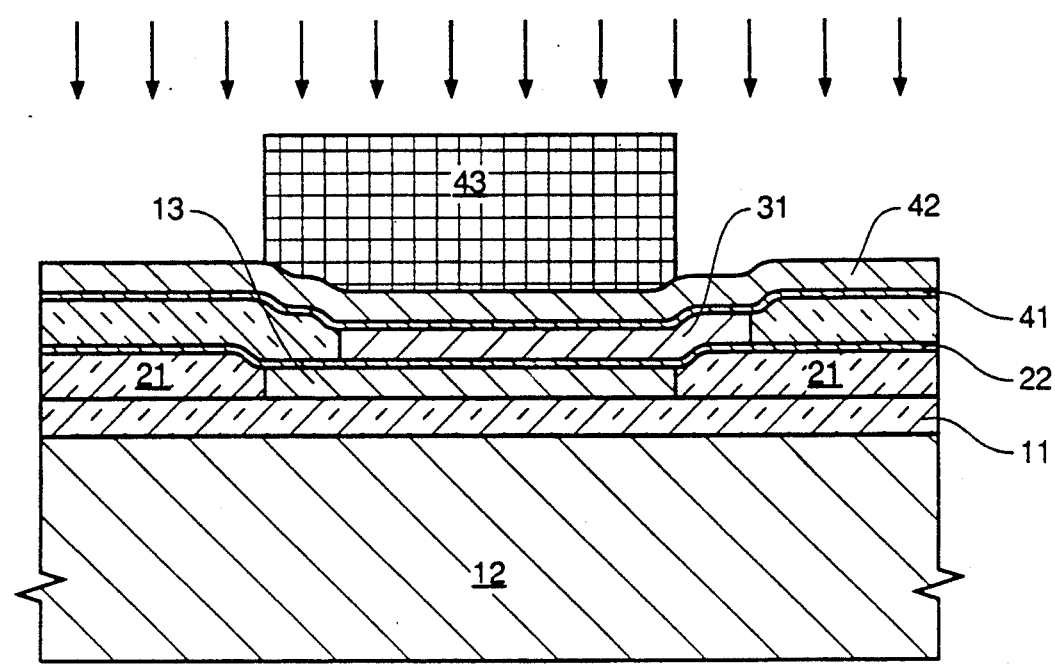

Referring now to FIG. 4, second photoresist mask 32 has been stripped, the wafer has again been thermally annealed, a second capacitive dielectric layer 41 has been blanket deposited on top of second poly layer 31, a third conductively-doped poly layer 42 has been deposited on top of second capacitive dielectric layer 41, third poly layer 42 has been masked with a third photoresist mask 43 that is essentially a duplicate of first photoresist mask 14, and aligned to the former position thereof. Unmasked portions of third poly layer 42 are then implanted with oxygen. Again, implantation energy and implantation dosage criteria are the same as for the earlier implants of first poly layer 13 and second poly layer 31.

Figure 5:
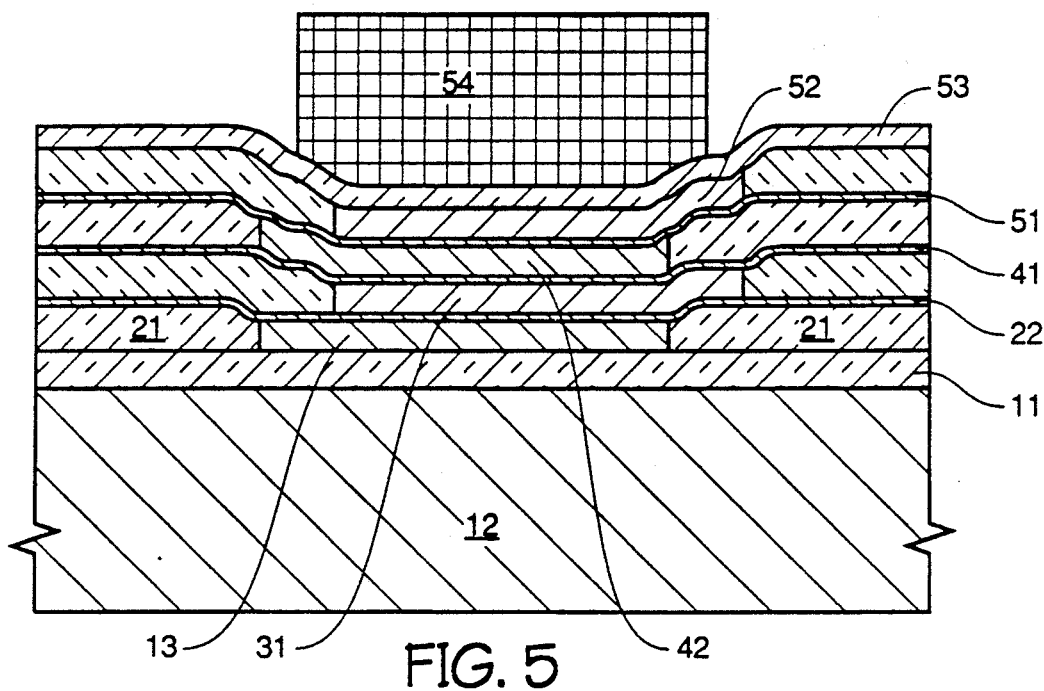

Referring now to FIG. 5, third photoresist mask 43 has been stripped, the wafer has again been thermally annealed, a third capacitive dielectric layer 51 has been blanket deposited on top of second poly layer 42, a fourth conductively-doped poly layer 52 has been deposited, masked with a fourth photoresist mask (not shown), implanted with oxygen using the same procedure used for earlier-deposited poly layers. Following a final annealing step, a capping dielectric layer 53 is blanket deposited, and the resultant layer stack is masked with a penultimate, stack-patterning photoresist mask 54. Penultimate photoresist mask 54 is sized and positioned such that the left edge thereof is superjacent both non-implanted regions of odd-numbered poly layers (in this case, first poly layer 13 and third poly layer 42) and oxygen-implanted regions of even-numbered poly layers (in this case second poly layer 31 and fourth poly layer 52), and the right edge thereof is superjacent both non-implanted regions of the even-numbered poly layers (poly layers 31 and 52) and oxygen-implanted regions of the odd-numbered poly layers (poly layers 13 and 42).

Figure 6:
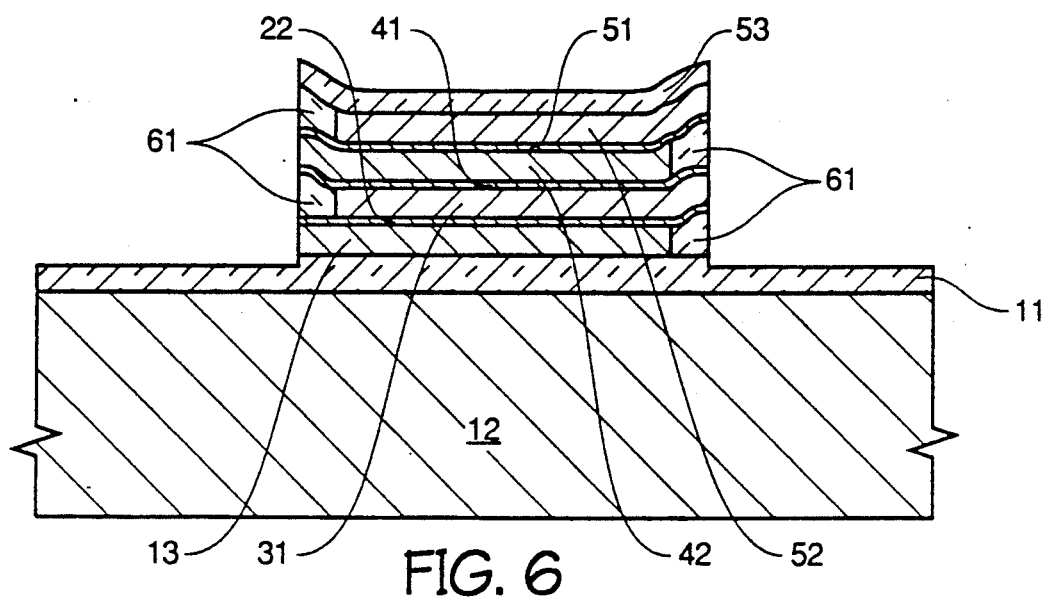

Referring now to FIG. 6, the layer stack has been anisotropically etched, stopping on the base dielectric layer 11. Penultimate photoresist mask 56 is then stripped. It will be noted that each poly layer has an insulated edge 61 consisting of a silicon dioxide border, and an opposite, non-insulated edge. Adjacent layers have their insulated and non-insulated edges reversed.

Figure 7:
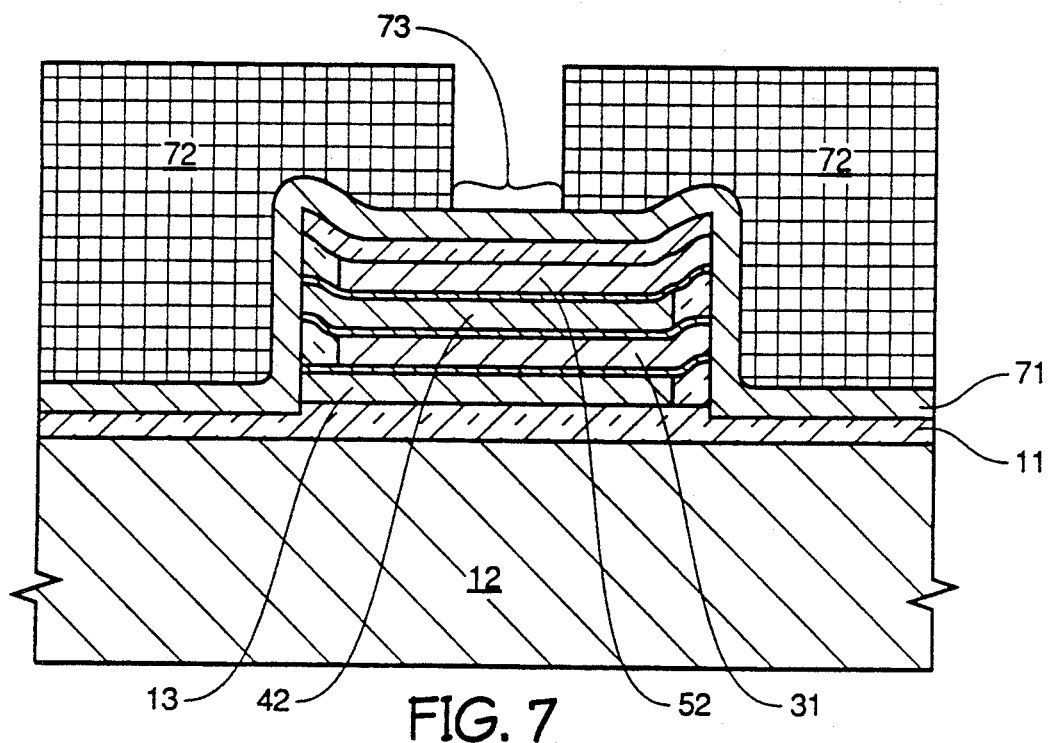

Referring now to FIG. 7, a tying poly layer 71 has been blanket deposited. Tying poly layer 71 is then masked with a final photoresist mask 72, such that an unmasked gap 73 remains on top of the stack.

Figure 8:
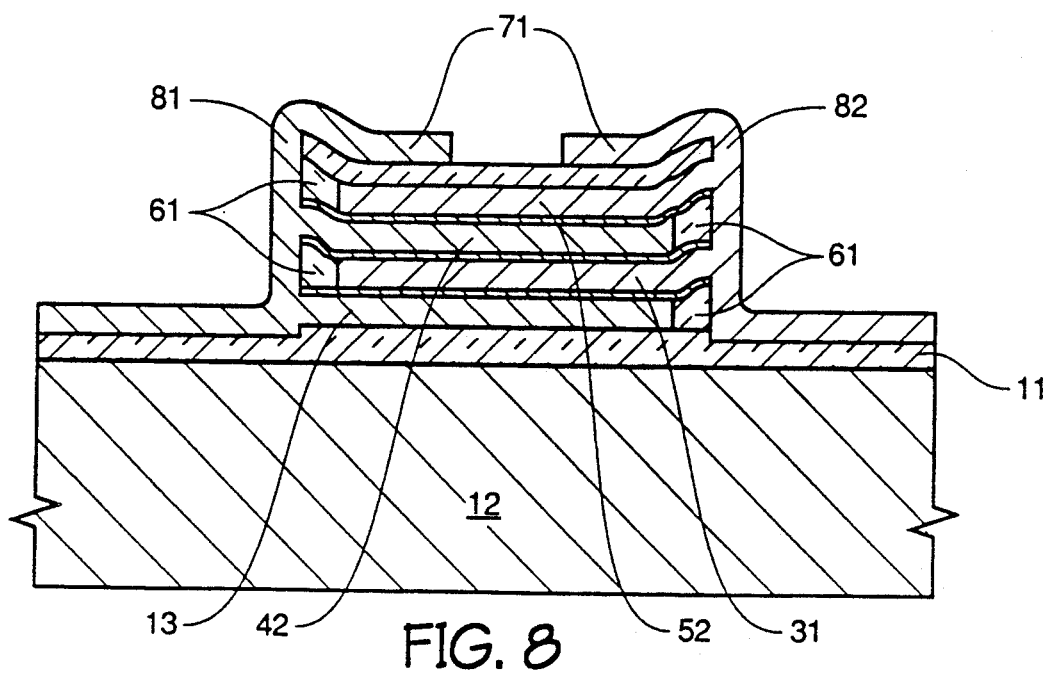

Referring now to FIG. 8, tying poly layer 71 has been etched such that it is divided into two portions, a first portion 81 that electrically connects the noninsulated edge of first poly layer 13 and third poly layer 42, and a second portion 82 that electrically connects the non-insulated edges of second poly layer 31 and fourth poly layer 52. Final photoresist mask 72 is then stripped. An interleaved-plate capacitor has now been formed. Each tying portion may be utilized to tie its respective capacitor plates to a part of a monolithic circuit.

It should be noted that a capacitor having additional interleaved conductive plates could be constructed, merely by adding additional doped poly layers and additional dielectric layers interposed therebetween. It should also be noted that conductive doping of the poly layers may be performed in situ (i.e., during deposition), or subsequent to deposition by implantation or diffusion. All three methods are well-known in the art.

Although only a single embodiment of the process has been disclosed herein, it will be obvious to those having ordinary skill in the art of semiconductor manufacture, that changes and modifications may be made thereto without departing from the spirit and scope of the invention as claimed.

I claim:

1. A process for fabricating a stacked capacitor from a stack of sequentially deposited layers on a wafer substrate comprising the following sequence of steps:
   a) deposition of a base dielectric layer on top of the substrate;
   b) deposition of a first polysilicon layer on top of the base dielectric layer;
   c) masking the first polysilicon layer with a first photoresist mask which defines a first capacitor plate;
   d) implanting unmasked regions of the first polysilicon layer with at least twice as many oxygen atoms per unit area as there are silicon atoms per unit area in the unmasked regions of the first polysilicon layer;
   e) removal of the first photoresist mask;
   f) thermally annealing the implanted regions of the first polysilicon layer in order to convert silicon atoms in the implanted regions into silicon dioxide;
   g) blanket deposition of a first capacitive dielectric layer on top of the first polysilicon layer;
   h) blanket deposition of a second polysilicon layer on top of the first capacitive dielectric layer;
   i) masking the second polysilicon layer with a second photoresist mask which defines a second capacitor plate, said second capacitor plate being horizontally misaligned with the first capacitor plate such that a first edge of the second plate overlaps a first edge of the first plate, and a second edge of the second plate underlaps a second edge of the first plate
   j) implanting unmasked regions of the second polysilicon layer with at least twice as many oxygen atoms per unit area as there are silicon atoms per unit area in the unmasked regions of the second polysilicon layer;
   k) removing the second photoresist mask;
   l) thermally annealing the implanted regions of the second polysilicon layer in order to convert silicon atoms in the implanted regions into silicon dioxide;
   m) blanket deposition of a capping dielectric layer on top of the second polysilicon layer;
   n) masking the capping dielectric layer with a penultimate photoresist mask that is sized and positioned such that a first edge thereof is superjacent both non-implanted regions of odd-numbered poly layers and oxygen-implanted regions of even-numbered poly layers, and a second edge thereof is superjacent both non-implanted regions of even-numbered poly layers and oxygen-implanted regions of odd-numbered poly layers;
   o) anisotropically etching through the layer stack, and stopping on the base dielectric layer;
   p) removing the penultimate photoresist mask;
   q) blanket deposition of a tying poly layer;
   r) masking the tying poly layer with a final photoresist mask so as to define a pair of non-adjacent tying layer segments, one of which is in intimate contact with non-implanted edges of odd-numbered poly layers and oxygen-implanted edges of even-numbered poly layers, the other segment being in intimate contact with non-implanted edges of even-numbered poly layers and oxygen-implanted edges of odd-numbered poly layers; and
   s) etching the tying poly layer so as to separate said segments.

2. The process of claim 1, which further comprises the following additional sequence of steps inserted between step 1) and step m):
   a') deposition of a second capacitive dielectric layer on top of the second poly layer;
   b') deposition of a third polysilicon layer on top of the second capacitive dielectric layer;
   c') masking the third polysilicon layer with a third photoresist mask which defines a third capacitor plate, said third capacitor plate being horizontally aligned with the first capacitor plate;
   d') implanting unmasked regions of the third polysilicon layer with at least twice as many oxygen atoms per unit area as there are silicon atoms per unit area in the unmasked regions of the third polysilicon layer;
   e') removal of the third photoresist mask; and
   f') thermally annealing the implanted regions of the third polysilicon layer in order to convert silicon atoms in the implanted regions into silicon dioxide.

3. The process of claim 2, which further comprises the additional sequence of steps inserted between step f') and step m):
   a") blanket deposition of a third capacitive dielectric layer on top of the third polysilicon layer;
   b") blanket deposition of a fourth polysilicon layer on top of the third capacitive dielectric layer;
   c") masking the fourth polysilicon layer with a fourth photoresist mask which defines a fourth capacitor plate, said fourth capacitor plate being horizontally aligned with said second capacitor plate;
   d") implanting unmasked regions of the fourth polysilicon layer with at least twice as many oxygen atoms per unit area as there are silicon atoms per unit area in the unmasked regions of the fourth polysilicon layer;
   e") removing the fourth photoresist mask; and
   f") thermally annealing the implanted regions of the fourth polysilicon layer in order to convert silicon atoms in the implanted regions into silicon dioxide.

4. The process of claim 1, wherein poly layers are conductively doped in-situ during deposition.

5. The process of claim 1, wherein poly layers are conductively doped subsequent to deposition.

6. The process of claim 2, wherein poly layers are conductively doped in-situ during deposition.

7. The process of claim 2, wherein poly layers are conductively dope subsequent to deposition.

8. The process of claim 3, wherein poly layers are conductively doped in-situ during deposition.

9. The process of claim 3, wherein poly layers are conductively doped subsequent to deposition.

10. The process of claim 1, wherein the dosage of implanted oxygen in within a range of one-fourth to parity with the number of silicon atoms present in the implanted regions of the polysilicon layers.

11. The process of claim 2, wherein the dosage of implanted oxygen in within a range of one-fourth to parity with the number of silicon atoms present in the implanted regions of the polysilicon layers.

12. The process of claim 3, wherein the dosage of implanted oxygen in within a range of one-fourth to parity with the number of silicon atoms present in the implanted regions of the polysilicon layers.

13. The process of claim 1, wherein oxygen is implanted into each polysilicon layer using energy calculated to position the majority of implanted oxygen atoms at a level that is approximately midway through the poly layer.

14. The process of claim 2, wherein oxygen is implanted into each polysilicon layer using energy calculated to position the majority of implanted oxygen atoms at a level that is approximately midway through the poly layer.

15. The process of claim 3, wherein oxygen is implanted into each polysilicon layer using energy calculated to position the majority of implanted oxygen atoms at a level that is approximately midway through the poly layer.

* * * * *